United States Patent
Chung (10) Patent No.: US 8,531,242 B2
(45) Date of Patent: Sep. 10, 2013

(54) OPERATIONAL AMPLIFIER WITH OVERDRIVING CIRCUIT AND METHOD FOR SAME

(75) Inventor: Kyu-Young Chung, Seoul (KR)

(73) Assignee: Magnachip Semiconductor, Ltd., Cheongju (KR)

( * ) Notice: Subject to any disclaimer, the term of this patent is extended or adjusted under 35 U.S.C. 154(b) by 0 days.

(21) Appl. No.: 13/034,040

(22) Filed: Feb. 24, 2011

(65) Prior Publication Data

US 2012/0049957 A1    Mar. 1, 2012

(30) Foreign Application Priority Data

Aug. 30, 2010   (KR) .................. 10-2010-0084413

(51) Int. Cl.
*H03F 3/45* (2006.01)
(52) U.S. Cl.
USPC .......................................... 330/255; 330/261
(58) Field of Classification Search
USPC .................. 330/254, 255, 260, 261
See application file for complete search history.

(56) References Cited

U.S. PATENT DOCUMENTS

| | | | |
|---|---|---|---|
| 5,663,675 A * | 9/1997 | O'Shaughnessy | 327/553 |
| 5,841,317 A * | 11/1998 | Ohmori et al. | 327/563 |
| 6,753,731 B2 * | 6/2004 | Maki | 330/255 |
| 6,859,100 B2 * | 2/2005 | Ballan | 330/255 |
| 7,920,025 B2 * | 4/2011 | Nishimura et al. | 330/255 |
| 2010/0097142 A1 | 4/2010 | Liang et al. | |

OTHER PUBLICATIONS

Korean Office Action issued on Aug. 19, 2011, in counterpart Korean Patent Application No. 10-2010-0084413 (3 pages).

* cited by examiner

*Primary Examiner* — Henry Choe
(74) *Attorney, Agent, or Firm* — NSIP Law (57) ABSTRACT

Disclosed is an operational amplifier including an overdriving circuit capable of reaching a target voltage within an operation time by outputting a higher voltage than the target voltage when an RC delay time is greater. The operational amplifier may including an overdriving circuit, in which first and second input terminals and an output terminal may be provided, an input voltage may be applied to the first input terminal, a second input terminal may be connected to the output terminal, and the input voltage applied to the first input terminal may be overdriven to have a certain level to be outputted to the output terminal, may include: first and second overdriving units performing an overdriving operation at a rising edge and a falling edge, respectively.

32 Claims, 7 Drawing Sheets

OPERATIONAL AMPLIFIER WITH OVERDRIVING CIRCUIT AND METHOD FOR SAME

CROSS-REFERENCE TO RELATED APPLICATION(S)

This application claims the benefit under 35 U.S.C. §119(a) of Korean Patent Application No. 10-2010-0084413, filed on Aug. 30, 2010 in the Korean Intellectual Property Office, the entire disclosure of which is incorporated herein by reference for all purposes.

BACKGROUND

1. Field

The following disclosure relates to an operational amplifier including an overdriving circuit and, more particularly, to an operational amplifier including an overdriving circuit capable of reaching a target voltage within an operation time by outputting a higher voltage than the target voltage when an RC delay time is greater.

2. Description of the Related Art

In general, an operational amplifier, having two input terminals and one output terminal, is an amplifier for amplifying the difference between voltages of the two input terminals. The input terminal of the operational amplifier is configured as a differential amplifier, and because a circuit for performing the four fundamental arithmetic operations can be configured by using the operational amplifier, it is called an "operational amplifier" in the sense of an operator. In actuality, the operational amplifier has a very high voltage gain and input impedance and very small output impedance.

Figure 1:
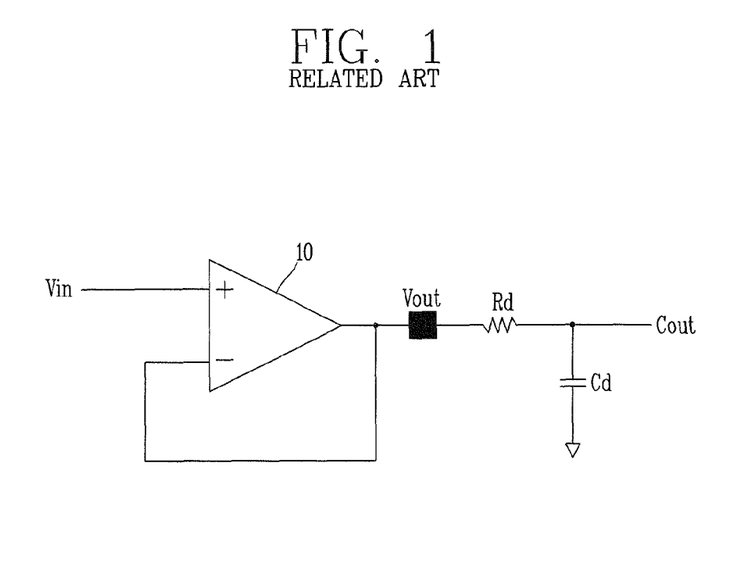
FIG. 1 illustrates a general operational amplifier.
Figure 2:
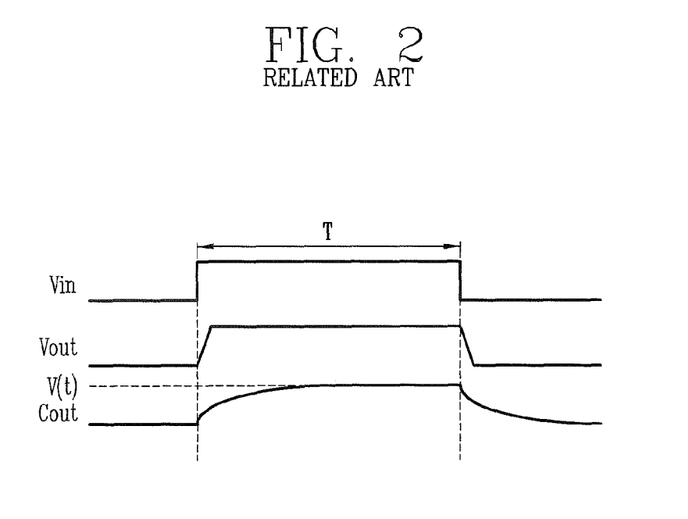
FIG. 2 is a timing diagram of the operational amplifier.

FIG. 1 illustrates a general operational amplifier, and FIG. 2 is a timing diagram of the operational amplifier.

With reference to FIGS. 1 and 2, an input voltage Vin is applied to an input terminal (+) of an operational amplifier 10, and an input terminal (−) is connected to an output terminal Vout. A resistor Rd and a capacitor Cd is connected to the output terminal Vout. When an input voltage Vin having a certain level is applied to the input terminal (+), the input voltage Vin, which has been amplified to have a certain level, is outputted from the output terminal Vout.

The operational amplifier 10 may be applicable for a data driving chip of a liquid crystal display (LCD), and in this case, the operational amplifier 10 is included in an output terminal of the data driving chip. In the data driving chip, the operational amplifier 10 is used as an analog buffer that outputs an inputted voltage to a data line, and in this case, the data line includes a high load, for example, the resistor Rd and the capacitor Cd, in view of an equivalent circuit.

It is designed such that the voltage of the operational amplifier has a sufficiently high slew rate to allow the voltage of an output terminal Cout of the capacitor to reach a target voltage Vt within an operation time T. Here, the slew rate is a thermometer that denotes how fast an output voltage is with respect to an input voltage, which is also called an "increase rate" of an output voltage.

In this case, however, when an RC delay time is relatively large while the operation time T is relatively small because the values of the resistor Rd and the capacitor Cd connected to the output terminal of the operational amplifier are great, no matter how fast the slew rate of the operational amplifier is, the RC delay time is large, so the voltage of the output terminal Cout cannot reach the target voltage Vt within the determined operation time T.

SUMMARY

In one general aspect, there is provided an operational amplifier including an overdriving circuit, the overdriving circuit including first and second input terminals and an output terminal, an input voltage being applied to the first input terminal, the second input terminal being connected to the output terminal, the input voltage applied to the first input terminal being overdriven to have a certain level to be outputted to the output terminal, the operational amplifier including: first and second overdriving units configured to perform an overdriving operation at a rising edge and a falling edge, respectively.

The operational amplifier may include: a first stage unit including the first and second input terminals and the output terminal, the first stage unit configured to provide a first bias current, a first overdriving unit connected to the first stage unit, the first overdriving unit configured to provide an offset current for performing the overdriving operation at the rising edge, a second overdriving unit connected to the first stage unit, the second overdriving unit configured to provide an offset current for performing the overdriving operation at the falling edge, and a buffer unit connected to the first and second overdriving units, the buffer unit configured to provide an output voltage.

In the operational amplifier, the first stage unit may include: a first PMOS transistor including: a gate connected to the input terminal, a source connected to a first current source, and a drain connected to a first node, a second PMOS transistor including: a gate connected to the output terminal, a source connected to the first current source, and a drain connected to a second node, a first NMOS transistor including: a gate connected to the input terminal, a source connected to a second current source, and a drain connected to a third node, and a second NMOS transistor including: a gate connected to the output terminal, a source connected to the second current source, and a drain connected to a fourth node.

In the operational amplifier, the first overdriving unit may include: a third PMOS transistor including: a gate to which a first bias voltage is applied, a source to which a driving voltage is applied, and a drain connected to a fifth node, and a fourth PMOS transistor including: a gate connected to a sixth node, a source connected to the fifth node, and a drain connected to the fourth node.

In the operational amplifier, the first overdriving unit may include a first switch including: one end connected to the drain of the fourth PMOS transistor, and another end connected to the fourth node.

In the operational amplifier, in response to the first switch being turned on, the operational amplifier may be configured to perform an overdriving operation at the rising edge.

In the operational amplifier, the second overdriving unit may include: a third NMOS transistor including: a gate connected to a seventh node, a source connected to an eighth node, and a drain connected to the second node, and a fourth NMOS transistor including: a gate to which a second bias voltage is applied, a source connected to a ground voltage, and a drain connected to the eighth node.

In the operational amplifier, the second overdriving unit may include a second switch including: one end connected to the second node, and another end connected to the drain of the third NMOS transistor.

In the operational amplifier, in response to the second switch being turned on, the operational amplifier may be configured to perform an overdriving operation at the falling edge.

In the operational amplifier, the buffer unit may include a CMOS-type transistor.

In the operational amplifier, the buffer unit may include: a fifth PMOS transistor including: a gate connected to the sixth node, a source to which a driving voltage is applied, and a drain connected to the output terminal, and a fifth NMOS transistor including: a gate connected to the seventh node, a source connected to a ground voltage, and a drain connected to the output terminal.

In the operational amplifier, the buffer unit may include an NMOS-type transistor.

In the operational amplifier, the buffer unit may include: a sixth NMOS transistor including: a gate connected to the sixth node, a source to which the driving voltage is applied, and a drain connected to the output terminal, and a seventh NMOS transistor including: a gate connected to the seventh node, a source connected to a ground voltage, and a drain connected to the output terminal.

The operational amplifier may further include a voltage detection unit positioned between the buffer unit and the first overdriving unit, the voltage detection unit being configured to operate the first overdriving unit.

In the operational amplifier, the voltage detection unit may include: a sixth PMOS transistor including: a gate to which a third bias voltage is applied, a source to which the driving voltage is applied, and a drain connected to the gate of the fourth PMOS transistor, and an eighth NMOS transistor including: a gate connected to the sixth node, a source connected to the output terminal, and a drain connected to the gate of the fourth PMOS transistor.

In the operational amplifier, in response to the buffer unit including an NMOS-type transistor, the first overdriving unit may be further configured to operate such that the operational amplifier is configured to perform overdriving operation at the rising edge.

In the operational amplifier, the buffer unit may include a PMOS-type transistor.

In the operational amplifier, the buffer unit may include: a seventh PMOS transistor including: a gate connected to the sixth node, a source to which the driving voltage is applied, and a drain connected to the output terminal, and an eighth PMOS transistor including: gate connected to the seventh node, a source connected to a ground voltage, and a drain connected to the output terminal.

The operational amplifier may further include a voltage detection unit positioned between the buffer unit and the second overdriving unit, the voltage detection unit being configured to operate the second overdriving unit.

In the operational amplifier, the voltage detection unit may include: a ninth PMOS transistor including: a gate connected to the seventh node, a source connected to the output terminal, and a drain connected to the gate of the third NMOS transistor, and a ninth NMOS transistor including: a gate to which a fourth bias voltage is applied, a source to which the ground voltage is applied, and a drain connected to the gate of the third NMOS transistor.

In the operational amplifier, in response to the buffer unit comprising a PMOS type transistor, the second overdriving unit may be further configured to operate such that the operational amplifier is configured to perform an overdriving operation at the falling edge.

In another general aspect, there is provided an operational amplifier, including: an overdriving circuit including: a first input terminal configured to receive an input voltage, a second input terminal configured to receive an input voltage, an output terminal, the second input terminal being connected to the output terminal, the input voltage applied to the first input terminal being overdriven to have a certain level to be outputted to the output terminal, a first overdriving unit configured to perform an overdriving operation at a rising edge, and a second overdriving unit configured to perform an overdriving operation at a falling edge.

In another general aspect, there is provided a method for an operational amplifier including an overdriving circuit, the overdriving circuit including first and second input terminals and an output terminal, an input voltage being applied to the first input terminal, the second input terminal being connected to the output terminal, the input voltage applied to the first input terminal being overdriven to have a certain level to be outputted to the output terminal, the method including: performing, with first and second overdriving units, an overdriving operation at a rising edge and a falling edge, respectively.

The method may further include: providing, with a first stage unit including the first and second input terminals and the output terminal, a first bias current, providing, with a first overdriving unit connected to the first stage unit, an offset current for performing the overdriving operation at the rising edge, providing, with a second overdriving unit connected to the first stage unit, an offset current for performing the overdriving operation at the falling edge, and providing, with a buffer unit connected to the first and second overdriving units, an output voltage.

The method may further include, in response to a first switch being turned on, performing an overdriving operation at the rising edge.

The method may further include, in response to a second switch being turned on, performing an overdriving operation at the falling edge.

In the method, the buffer unit may include a CMOS-type transistor.

In the method, the buffer unit may include an NMOS-type transistor.

The method may further include operating, with a voltage detection unit positioned between the buffer unit and the first overdriving unit, the first overdriving unit.

The method may further include, in response to the buffer unit including an NMOS-type transistor, operating the first overdriving unit, such that the method further includes performing overdriving operation at the rising edge.

In the method, the buffer unit may include a PMOS-type transistor.

The method may further include operating, with a voltage detection unit positioned between the buffer unit and the second overdriving unit, the second overdriving unit.

The method may further include, in response to the buffer unit including a PMOS-type transistor, operating the second overdriving unit, such that the method further includes performing an overdriving operation at the falling edge.

Other features and aspects may be apparent from the following detailed description, the drawings, and the claims.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, descriptions of well-known functions and constructions may be omitted for increased clarity and conciseness.

Figure 3:
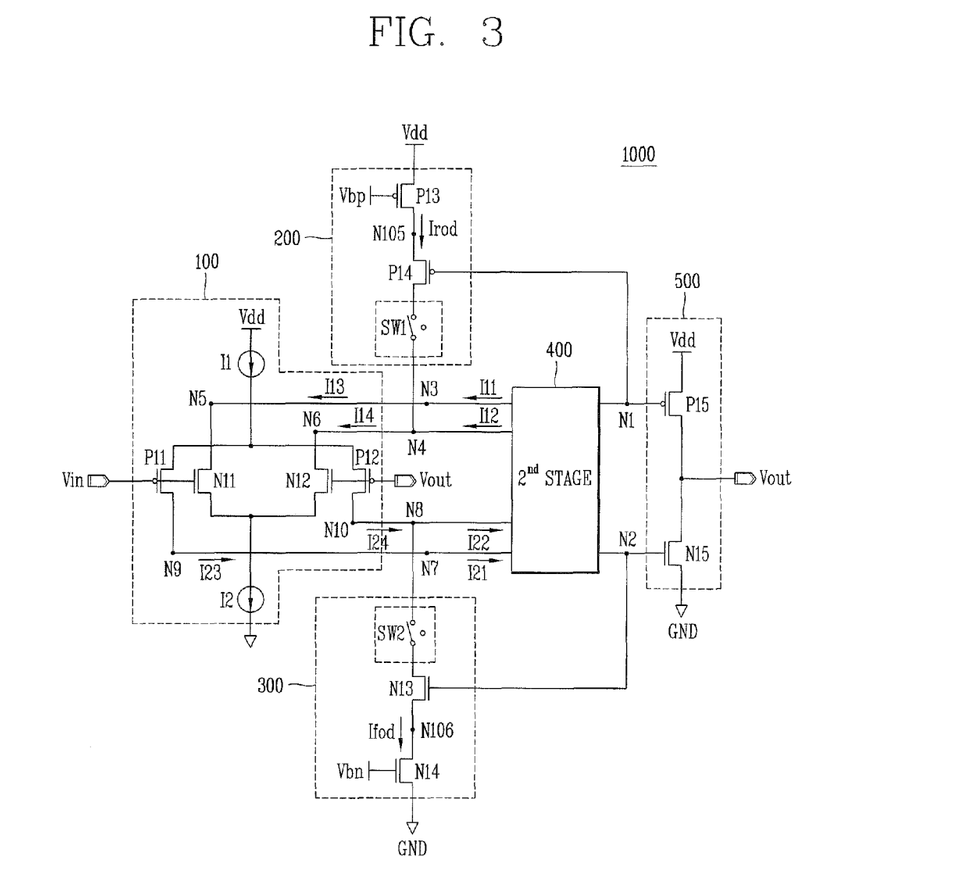
FIG. 3 is a circuit diagram of an operational amplifier including an overdriving circuit according to an example embodiment.
Figure 4:
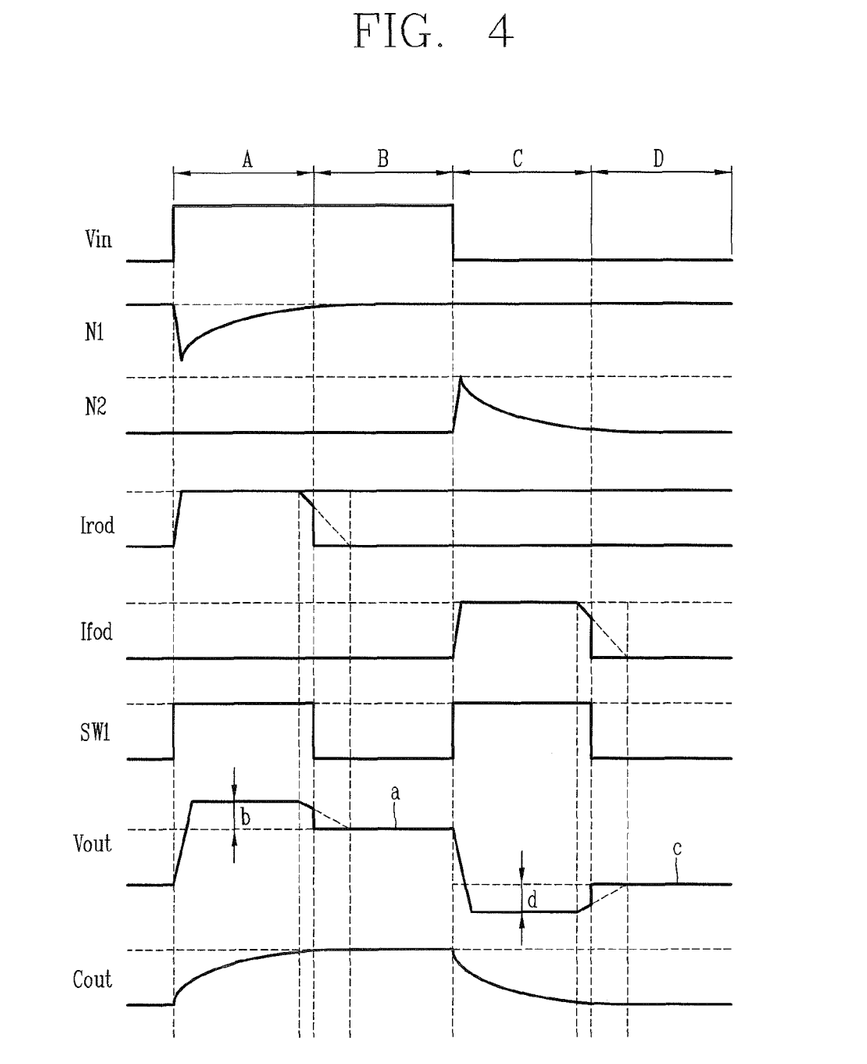
FIG. 4 is a timing diagram showing an operation of the operational amplifier including an overdriving circuit according to an example embodiment.

FIG. 3 is a circuit diagram of an operational amplifier including an overdriving circuit according to an example embodiment, and FIG. 4 is a timing diagram showing an operation of the operational amplifier including an overdriving circuit according to an example embodiment.

With reference to FIG. 3, an operational amplifier 1000 including an overdriving circuit, according to an example embodiment, may include a first stage unit 100, first and second overdriving units 200 and 300, a second stage unit 400, and a buffer unit 500.

The first stage unit 100 may include two input terminals and an output terminal, and may provide a bias current. Also, the first stage unit 100 may include PMOS (or p-type) transistors P11 and P12, NMOS (or n-type) transistors N11 and N12, and current sources I1 and I2.

An input voltage Vin may be applied to gates of the PMOS transistor P11 and the NMOS transistor N11. The gates of the PMOS transistor P12 and the NMOS transistor N12 may be connected to an output voltage Vout.

For example, a drain of the PMOS transistor P11 may be connected to a node N9, and a drain of the PMOS transistor P12 may be connected to a node N10. A drain of the NMOS transistor N11 may be connected to a node N5, and a drain of the NMOS transistor N12 may be connected to a node N6. A node between the node N5 and the second stage circuit 400 is a node N3. A current I11 passes into the node N3, and a current I13 passes out of the node N3. A node between the node N9 and the second stage circuit 400 is a node N7. A current I23 passes into the node N7, and a current I21 passes out of the node N7.

The current source I1 may be connected to sources of the PMOS transistors P11 and P12, and the current source I2 may be connected to sources of the NMOS transistor N11 and N12.

The first overdriving unit 200 may be connected to the first stage unit 100, and may provide an offset current Irod for an overdriving operation at a rising edge. Also, the first overdriving unit 200 may include PMOS transistors P13 and P14 and a switch SW1.

A bias voltage Vbp may be applied to a gate of the PMOS transistor P13, and a driving voltage Vdd may be applied to a source of the PMOS transistor P13. A gate of the PMOS transistor P14 may be connected to a node N1, and a source of the PMOS transistor P14 may be connected to a drain of the PMOS transistor P13 at a node N105. One end of the switch SW1 may be connected to a drain of the PMOS transistor P14, and the other end thereof may be connected to a node N4. A current I12 passes into the node N4, and a current I14 passes out of the node N4.

For example, the switch SW1 may determine a mode of the operational amplifier. In response to the switch SW1 being turned on, the operational amplifier may operate in an overdriving mode. In response to the switch SW1 being turned off, the operational amplifier may operate in a normal mode. In one example, the operational amplifier may operate as an overdriving circuit at a rising edge in which voltage is changed from a low level to a high level.

The second overdriving unit 300 may be connected to the first stage 100 and may provide an offset current Ifod for an overdriving operation at a falling edge. Also, the second overdriving unit 300 may include NMOS transistors N13 and N14 and a switch SW2.

A gate of the NMOS transistor N13 may be connected to a node N2, a drain of the NMOS transistor N13 may be connected to one end of the switch SW2, and a source of the NMOS transistor N13 may be connected to a drain of the NMOS transistor N14 at a node N106. A bias voltage Vbn may be applied to a gate of the NMOS transistor N14, and a source of the NMOS transistor N14 may be connected to a ground voltage GND. One end of the switch SW2 may be connected to a drain of the NMOS transistor N13, and the other end of the switch SW2 may be connected to a node N8. A current I24 passes into the node N8, and a current I22 passes out of the node N8.

For example, the switch SW2 may determine a mode of the operational amplifier. In response to the switch SW2 being turned on, the operational amplifier may operate in an overdriving mode. In response to the switch SW2 being turned off, the operational amplifier may operate in a normal mode. In one example, the operational amplifier may operate as an overdriving circuit at a falling edge in which voltage is changed from a high level to a low level.

The second stage unit 400 may vary depending on a circuit designer. For example, the second stage unit 400 may be designed as a circuit, such as a common source amplifier.

The buffer unit 500 may be connected to the first and second overdriving units 200 and 300, and may provide an output voltage Vout. The buffer unit 500 may be formed as a CMOS-type transistor including a PMOS transistor P15 and an NMOS transistor N15.

A gate of the PMOS transistor P15 may be connected to the node N1, a driving voltage Vdd may be applied to a source of the PMOS transistor P15, and a drain of the PMOS transistor P15 may be connected to an output terminal of the operational amplifier 1000. A gate of the NMOS transistor N15 may be connected to the node N2, a drain of the NMOS transistor N15 may be connected to an output terminal of the operational amplifier, and a source of the NMOS transistor N15 may be connected to a ground voltage GND.

For example, as an overdriven output voltage Vout compared to the input voltage Vin may be outputted at the rising edge of FIG. 4, the PMOS transistor P15 of the buffer unit 500 may be designed to be larger than the width of the PMOS transistor P14 of the first overdriving unit 200.

Also, as an overdriven output voltage Vout compared to the input voltage Vin may be outputted at the falling edge of FIG. 4, the NMOS transistor N15 of the buffer unit 500 may be designed to be larger than the width of the NMOS transistor N13 of the second overdriving unit 300.

The rising edge overdriving operation of the operational amplifier including the overdriving circuit will now be described with reference to FIGS. 3 and 4.

With reference to FIGS. 3 and 4, the operational amplifier 1000 including an overdriving circuit according to an example embodiment may output the output voltage Vout, which has been overdriven, to have a certain level through the operational amplifier 1000. For example, on a presumption that the switch SW1 of the first overdriving unit 200 is turned on, the operational amplifier 1000 may operate in an overdriving mode in the rising edge. At this time, the second overdriving unit 300 may not operate.

A section "A" in FIG. 4 indicates a section (or time period) in which the operational amplifier may operate in the overdriving mode at the rising edge. In response to the operational amplifier operating in the overdriving mode at the rising edge, the input voltage Vin may be gradually increased in a steady state. At this time, a low level voltage may be applied to the gate of the PMOS transistor P15 of the buffer unit 500 in order to drive a high load, e.g., an RC circuit, connected to the output terminal, such that the PMOS transistor P15 may be turned on. For example, as the gate of the PMOS transistor P14 is connected to the node N1, the low level voltage may be applied to the gate of the PMOS transistor P14 connected to the node N1, turning on the PMOS transistor P14.

When it is presumed that the bias voltage Vbp having a certain level is applied to the gate of the PMOS transistor P13, the PMOS transistor P13 may be turned on to generate an offset current hod in a forward direction. In one example, the offset current Irod may flow to the node N4 through the switch SW1.

For example, on a presumption that current flowing to the node N3 is $I_{11}$, current flowing to the node N4 is $I_{12}$, current flowing to the node N5 is $I_{13}$, and current flowing to the node N6 is $I_{14}$; Equation 1 and Equation 2 shown below may be established. In one example, as the output voltage Vout overdriven compared to the input voltage Vin is to be outputted to the output terminal, Equation 1 and Equation 2 should be equal.

$$I_{13} = I_{11} \qquad \text{[Equation 1]}$$

$$I_{14} = I_{12} + I\text{rod} \qquad \text{[Equation 2]}$$

For example, as the offset current hod may flow through the switch SW1 to the node N4, Equation 3 shown below may be obtained. In one example, the offset current Irod may flow in a forward direction and has a positive (+) value.

$$I_{14} = I_{13} + I\text{rod} \qquad \text{[Equation 3]}$$

Thus, the current $I_{14}$ of $I_{13}$+Irod as represented by Equation 3 may flow to the node N6, such that the output voltage Vout, which has been overdriven by "b" compared to the input voltage Vin, may be outputted to the output terminal as shown in FIG. 4.

A section "B" in FIG. 4 indicates a section (or time period) in which the operational amplifier may operate in a steady state. In response to the operational amplifier operating in the steady state, the switch SW1 of the first overdriving unit 200 may be turned off, releasing the overdriving mode. In response to the voltage of the output terminal Cout of the capacitor connected to the output terminal of the operational amplifier being close to a target voltage Vt, e.g., "a", the voltage of the node N1 may be increased, the PMOS transistor P14 may be gradually turned off, and the offset current Irod may become small, thus reducing the overdriven voltage outputted from the output terminal.

In response to the voltage of the output terminal Cout of the capacitor connected to the output terminal of the operational amplifier reaching the target voltage Vt, e.g., "a", the voltage of the node N1 may become equal to the target voltage Vt, the PMOS transistor P14 may be completely turned off, and the offset current hod may not flow. Thus, the voltage outputted from the output terminal may become equal to the input voltage Vin.

The falling edge overdriving operation of the operational amplifier including an overdriving circuit will now be described with reference to FIGS. 3 and 4.

As shown in FIGS. 3 and 4, as for the operational amplifier including an overdriving circuit according to an example embodiment, in response to the input voltage Vin being inputted to the operational amplifier, the output voltage Vout, which has been overdriven to have a certain level, may be outputted. For example, on a presumption that the switch SW2 of the second overdriving unit 300 is turned on, the operational amplifier may operate in the overdriving mode at the falling edge. At this time, the first overdriving unit 200 may not operate.

A section "C" in FIG. 4 indicates a section (or time period) in which the operational amplifier may operate in the overdriving mode at the falling edge. In response to the operational amplifier operating in the overdriving mode at the falling edge, the input voltage Vin may be gradually decreased in a steady state. At this time, a high level voltage may be applied to the gate of the NMOS transistor N15 of the buffer unit 500 in order to drive a high load, e.g., an RC circuit, connected to the output terminal, such that the NMOS transistor N15 may be turned on. For example, as the gate of the NMOS transistor N13 may be connected to the node N2, the high level voltage may be applied to the gate of the NMOS transistor N13 connected to the node N2, turning on the NMOS transistor N13.

When it is presumed that the bias voltage Vbn having a certain level is applied to the gate of the NMOS transistor N14, the NMOS transistor P14 may be turned on to generate an offset current Ifod in a backward direction. In one example, the offset current Ifod may flow to the ground voltage GND through the NMOS transistor N14.

For example, on a presumption that current flowing to the node N7 is $I_{21}$, current flowing to the node N8 is $I_{22}$, current flowing to the node N9 is $I_{23}$, and current flowing to the node N10 is $I_{24}$; Equation (4) and Equation (5) shown below may be established. In one example, as the output voltage Vout overdriven compared to the input voltage Vin may be to be outputted to the output terminal, Equation (4) and Equation (5) should be equal.

$$I_{23} = I_{21} \qquad \text{[Equation 4]}$$

$$I_{24} = I_{22} + I\text{fod} \qquad \text{[Equation 5]}$$

For example, because the offset current Ifod may flow through the NMOS transistor N14 to the ground voltage GND, Equation 6 shown below may be obtained. In one example, the offset current Ifod may flow in a backward direction and may have a negative (−) value.

$$I_{24} = I_{23} + Ifod \quad \text{[Equation 6]}$$

Thus, the current $I_{24}$ of $I_{23}$+Ifod as represented by Equation 6 may flow to the node N10, such that the output voltage Vout, which has been overdriven by "d" compared to the input voltage Vin, may be outputted to the output terminal as shown in FIG. 4.

A section "D" in FIG. 4 indicates a section (or time period) in which the operational amplifier may operate in a steady state. In response to the operational amplifier operating in the steady state, the switch SW2 of the second overdriving unit 300 may be turned off, releasing the overdriving mode. In response to the voltage of the output terminal Cout of the capacitor connected to the output terminal of the operational amplifier being close to the target voltage Vt, e.g., "c", the voltage of the node N2 may be decreased, the NMOS transistor N13 may be gradually turned off, and the offset current Ifod may become small, thus reducing the overdriven voltage outputted from the output terminal.

In response to the voltage of the output terminal Cout of the capacitor connected to the output terminal of the operational amplifier reaching the target voltage Vt, e.g., "c", the voltage of the node N2 may become equal to the target voltage Vt, the NMOS transistor N13 may be completely turned off, and the offset current Ifod may not flow. Thus, the voltage outputted from the output terminal may become equal to the input voltage Vin.

Figure 5:
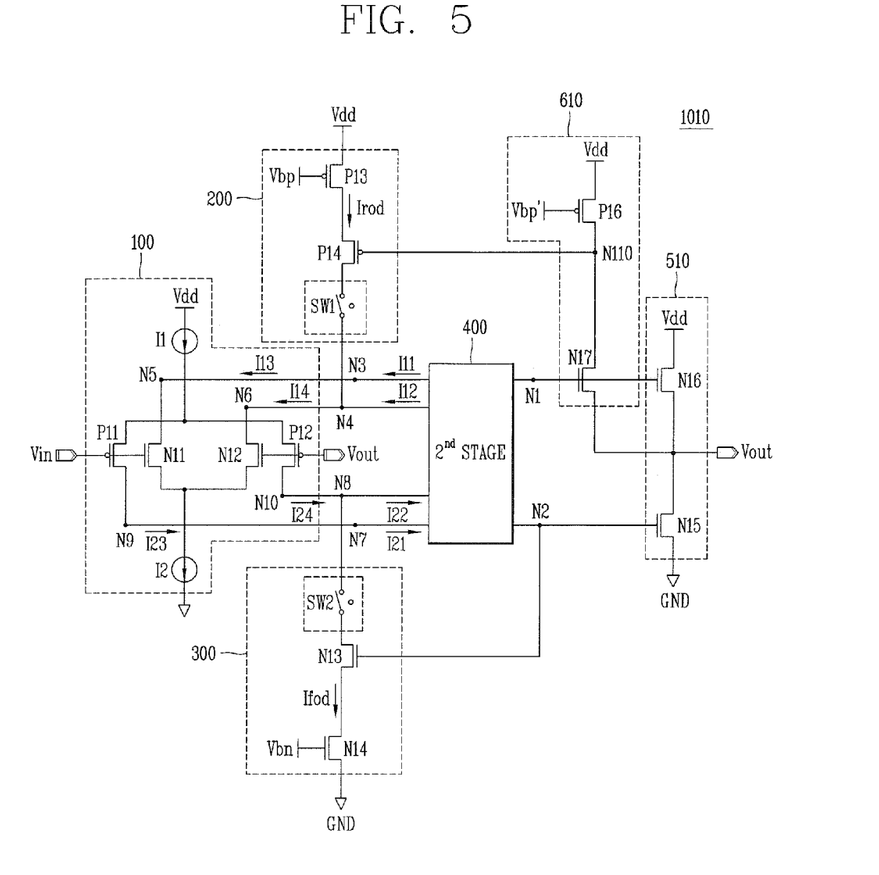
FIG. 5 is a circuit diagram of an operational amplifier including an overdriving circuit according to another example embodiment.
Figure 6:
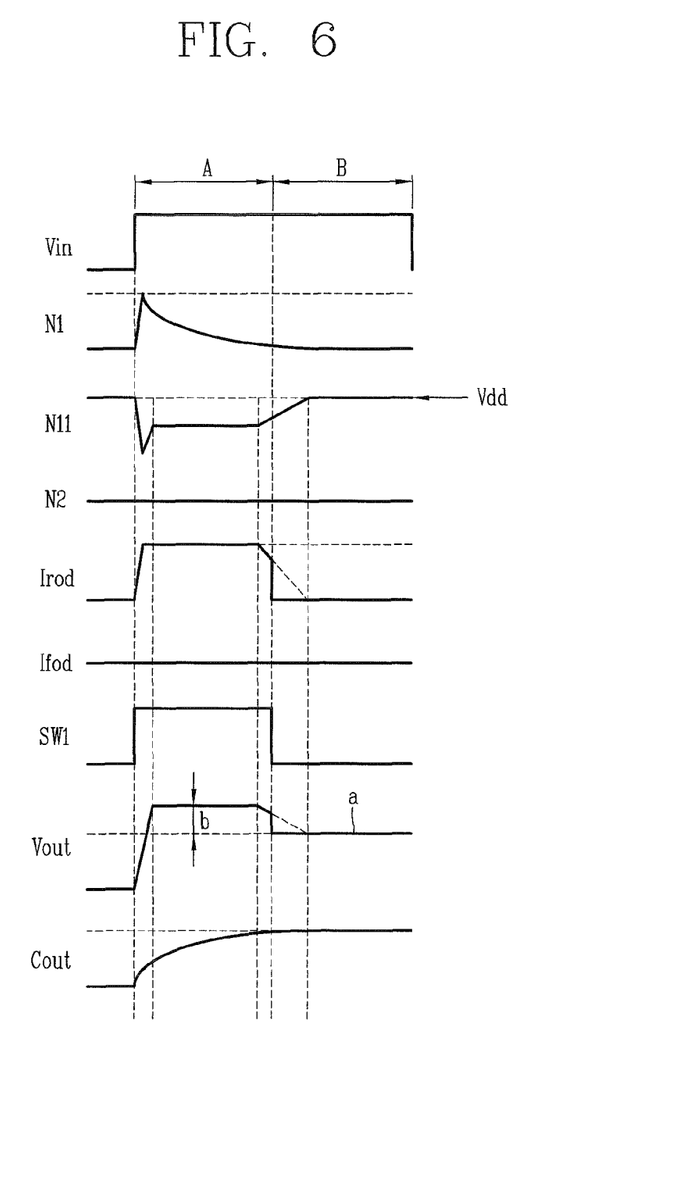
FIG. 6 is a timing diagram showing an operation of the operational amplifier including an overdriving circuit according to another example embodiment.

FIG. 5 is a circuit diagram of an operational amplifier including an overdriving circuit according to another example embodiment, and FIG. 6 is a timing diagram showing an operation of the operational amplifier including an overdriving circuit according to another example embodiment.

With reference to FIG. 5, the operational amplifier 1010 including an overdriving circuit according to an example embodiment includes a first stage unit 100, first and second overdriving units 200 and 300, a second stage unit 400, a buffer unit 510, and a voltage detection unit 610.

For example, the first stage unit 100, the first and second overdriving units 200 and 300, and the second stage unit 400 may have the same configurations as those of the former example embodiment.

The buffer unit 510 may be formed as an NMOS type transistor including the NMOS transistor N15 and an NMOS transistor N16.

For example, because the NMOS transistor N16 is used in the place of the PMOS transistor P15 in the example of FIG. 3, a voltage detection unit 610 for detecting the voltage between the first overdriving unit 200 and the buffer unit 510 may be used.

The voltage detection unit 610 may be positioned between the first overdriving unit 200 and the buffer unit 510, and may include a PMOS transistor P16 and an NMOS transistor N17.

A bias voltage Vbp' may be applied to a gate of the PMOS transistor P16, a driving voltage Vdd may be applied to the source of the PMOS transistor P16, and a drain of the PMOS transistor P16 may be connected to a node N110. A gate of the NMOS transistor N17 may be connected to the node N1, a drain of the NMOS transistor N17 may be connected to the node N110, and a source of the NMOS transistor N17 may be connected to an output terminal of the operational amplifier 1010.

A rising edge overdriving operation of the operational amplifier including the overdriving circuit will now be described with reference to FIGS. 5 and 6.

A section "A" in FIG. 6 is a section (or time period) in which the operational amplifier may operate in the overdriving mode at a rising edge. In response to the operational amplifier operating in the overdriving mode at the rising edge, the input voltage Vin may be gradually increased in a steady state. In one example, in order to drive the high load, e.g., the RC circuit, connected to the output terminal, a high level voltage may be applied to the gate of the NMOS transistor N16 of the buffer unit 510 to turn on the NMOS transistor N16, and the voltage of the node N1 may have a high level, such that the NMOS transistor N17 connected to the node N1 may be also turned on.

When it is presumed that bias voltages Vbp and Vbp', each having a certain level, are applied to the gate of the PMOS transistor P13 of the first overdriving unit 200 and the gate of the PMOS transistor P16 of the voltage detection unit 610, the PMOS transistors P13 and P16 may be turned on, such that the voltage of the node N110 may be lowered from the driving voltage Vdd to the output voltage Vout, and the PMOS transistor P14 connected thereto may be turned on to generate an offset current hod in a forward direction. Then, the offset current hod may flow to the node N4. Thus, the current $I_{14}$ of $I_{13}$+Irod, as represented by Equation 3, may flow to the node N6, such that that the output voltage Vout, which has been overdriven by "b" compared with the input voltage Vin, may be outputted to the output terminal as shown in FIG. 6.

A section "B" in FIG. 6 is a section (or time period) in which the operational amplifier may operate in the steady state. In response to the operational amplifier operating in the steady state, the switch SW1 of the first overdriving unit 200 may be turned off to release the overdriving mode. In response to the voltage of the output terminal Cout of the capacitor connected to the output terminal of the operational amplifier becoming close to the target voltage Vt, e.g., "a", the voltage of the node N110 may increase, the PMOS transistor P14 may be gradually turned off, and the offset current Irod may be reduced, such that the overdriving voltage outputted from the output terminal may be reduced.

In response to the voltage of the output terminal Cout of the capacitor connected to the output terminal of the operational amplifier reaching the target voltage Vt, e.g., "a", the voltage of the node N110 may be equal to the target voltage Vt, the PMOS transistor P14 may be completely turned off, and the offset current hod may not flow, such that the voltage outputted from the output terminal may be equal to the input voltage Vin.

For example, the falling edge overdriving operation and steady state operation of the operational amplifier including the overdriving circuit of FIG. 5 may be the same as those of the operational amplifier including the overdriving circuit of FIG. 3.

Figure 7:
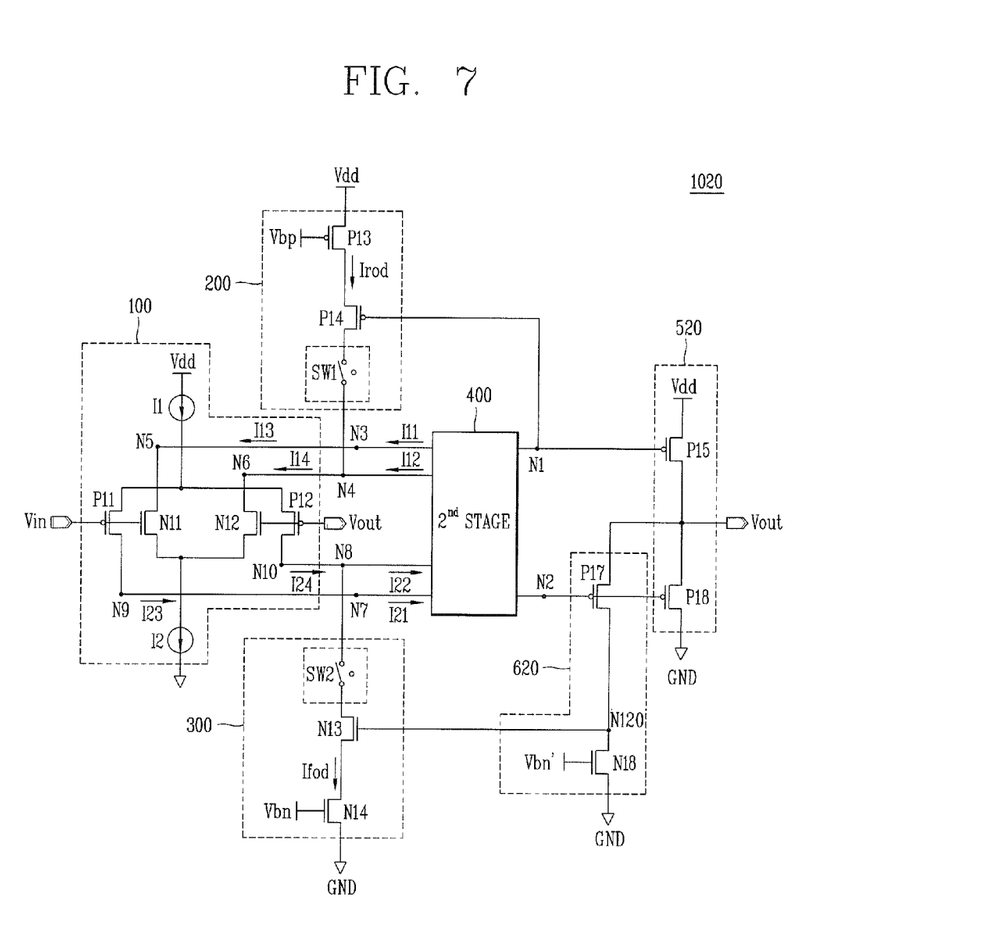
FIG. 7 is a circuit diagram of an operational amplifier including an overdriving circuit according to still another example embodiment.
Figure 8:
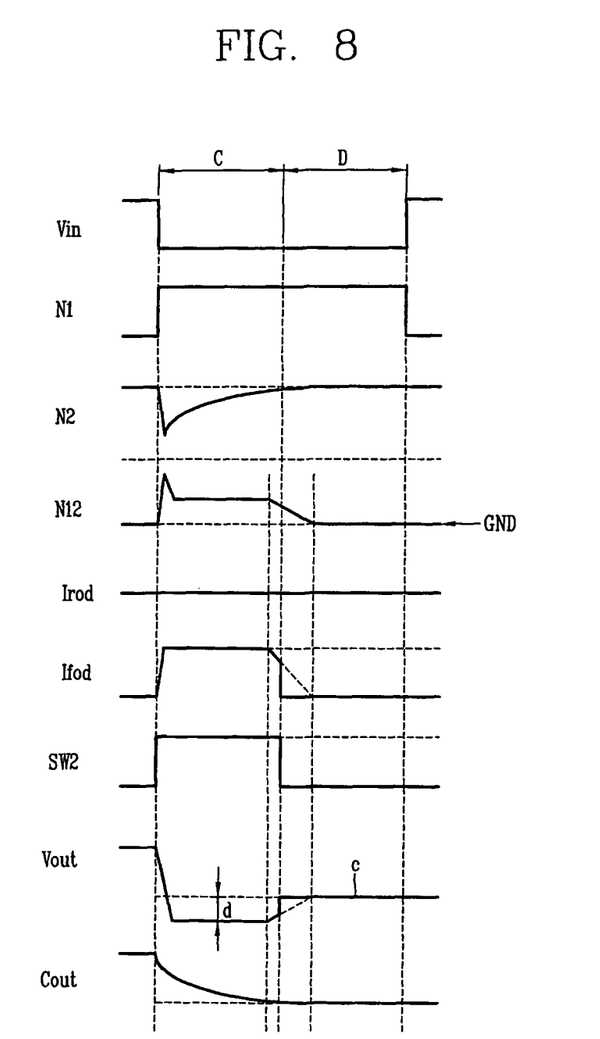
FIG. 8 is a timing diagram showing an operation of the operational amplifier including an overdriving circuit according to still another example embodiment.

FIG. 7 is a circuit diagram of an operational amplifier including an overdriving circuit according to still another example embodiment, and FIG. 8 is a timing diagram showing an operation of the operational amplifier including an overdriving circuit according to still another example embodiment.

With reference to FIG. 7, an amplifier 1020 including an overdriving circuit according to still another example embodiment may include a first stage unit 100, first and second overdriving units 200 and 300, a second stage unit 400, a buffer unit 520, and a voltage detection unit 620.

For example, the first stage unit 100, the first and second overdriving units 200 and 300 and the second stage unit 400 may have the same configuration as those of FIG. 3.

The buffer unit 520 may be formed as a PMOS type transistor including the PMOS transistor P15 and a PMOS transistor P18. For example, the PMOS transistor P18 may be used, instead of the NMOS transistor N15 of FIG. 3, such that a circuit for detecting voltage between the second overdriving unit 300 and the buffer unit 520 may be used.

The voltage detection unit 620 may be positioned between the second overdriving unit 300 and the buffer unit 520, and may include a PMOS transistor P17 and an NMOS transistor N18.

A gate of the PMOS transistor P17 may be connected to the node N2, a source of the PMOS transistor P17 may be connected to an output terminal of the operational amplifier, and a drain of the PMOS transistor P17 may be connected to a node N120. A bias voltage Vbn' may be applied to a gate of the NMOS transistor N18, a drain of the NMOS transistor N18 may be connected to the node N120, and a source of the NMOS transistor N18 may be connected to a ground voltage GND.

For example, the falling edge overdriving operation and steady state operation of the operational amplifier including the overdriving circuit of FIG. 7 may be the same as those of the operational amplifier including the overdriving circuit of FIG. 3.

The falling edge overdriving operation of the operational amplifier including an overdriving circuit will now be described with reference to FIGS. 7 and 8.

With reference to FIGS. 7 and 8, the operational amplifier including an overdriving circuit according to still another example embodiment may output an output voltage Vout obtained as the input voltage Vin has been overdriven to have a certain level through the operational amplifier. For example, when it is presumed that the switch SW2 of the second overdriving unit 300 is turned on, the operational amplifier may operate in an overdriving mode in the falling edge. In one example, the first overdriving unit 200 may not operate.

A section "C" in FIG. 8 indicates a section (or time period) in which the operational amplifier may operate in the overdriving mode at the falling edge. In response to the operational amplifier operating in the overdriving mode at the falling edge, the input voltage Vin may be gradually decreased in a steady state. At this time, a low level voltage may be applied to the gate of the PMOS transistor P18 of the buffer unit 520 in order to drive a high load, e.g., an RC circuit, connected to the output terminal, such that the PMOS transistor P18 may be turned on. For example, as the gate of the PMOS transistor P17 may be connected to the node N2, the low level voltage may be applied to the gate of the PMOS transistor P17 connected to the node N2, turning on the PMOS transistor P17.

When it is presumed that bias voltages Vbn and Vbn' each having a certain level are applied to the gate of the NMOS transistor N14 of the second overdriving unit and the gate of the NMOS transistor N18 of the voltage detection unit 620, respectively, the NMOS transistors N14 and N18 may be turned on, such that the voltage of the node N120 may be increased from the ground voltage GND to the output voltage Vout, and the NMOS transistor N13 connected thereto may be turned on, generating an offset current Ifod in a reverse direction. Then, the offset current Ifod may flow to the ground voltage GND through the NMOS transistor N14.

Thus, the current of $I_{24}=I_{33}+Ifod$, as represented by Equation 6, may flow to the node N10, such that the output voltage Vout, which has been overdriven by "d" compared with the input voltage Vin, may be outputted to the output terminal as shown in FIG. 8.

A section "D" in FIG. 8 indicates a section (or time period) in which the operational amplifier may operate in a steady state. In response to the operational amplifier operating in the steady state, the switch SW2 of the second overdriving unit 300 may be turned off, releasing the overdriving mode. In response to the voltage of the output terminal Cout of the capacitor connected to the output terminal of the operational amplifier being close to the target voltage Vt, e.g., "c", the voltage of the node N120 may be decreased, the NMOS transistor N13 may be gradually turned off, and the offset current Ifod may become small, thus reducing the overdriven voltage outputted from the output terminal.

In response to the voltage of the output terminal Cout of the capacitor connected to the output terminal of the operational amplifier reaching the target voltage Vt, e.g., "c", the voltage of the node N120 may become equal to the target voltage Vt, the NMOS transistor N13 may be completely turned off, and the offset current Irod may not flow. Thus, the voltage outputted from the output terminal may become equal to the input voltage Vin.

As described above, the operational amplifier according to an example embodiment may include the overdriving circuit therein, to output the input voltage as a voltage which has been overdriven to have a certain level, reducing the RC delay generated due to a high load connected to the output terminal. Thus, the output voltage may reach a target voltage within a predetermined operation time, and thus, the operational amplifier may be designed to have a high slew rate.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. As an example, the PMOS (p-type) and NMOS (n-type) transistors may be switched, with other circuitry adjusted accordingly. Accordingly, other implementations are within the scope of the following claims.

What is claimed is:

1. An operational amplifier, comprising:
   first and second input terminals, an input voltage being applied to the first input terminal; and
   an output terminal, the second input terminal being connected to the output terminal, the input voltage applied to the first input terminal being overdriven to have a certain level to be outputted to the output terminal;
   first and second overdriving units configured to perform an overdriving operation at a rising edge and a falling edge, respectively;
   a first stage unit comprising the first and second input terminals and the output terminal, the first stage unit configured to provide a first bias current;
   a first overdriving unit connected to the first stage unit, the first overdriving unit configured to provide an offset current for performing the overdriving operation at the rising edge; and
   a second overdriving unit connected to the first stage unit, the second overdriving unit configured to provide an offset current for performing the overdriving operation at the falling edge.

2. The operational amplifier of claim 1, wherein the first stage unit comprises:
a first PMOS transistor comprising:
a gate connected to the input terminal;
a source connected to a first current source; and
a drain connected to a first node;
a second PMOS transistor comprising:
a gate connected to the output terminal;
a source connected to the first current source; and
a drain connected to a second node;
a first NMOS transistor comprising:
a gate connected to the input terminal;
a source connected to a second current source; and
a drain connected to a third node; and
a second NMOS transistor comprising:
a gate connected to the output terminal;
a source connected to the second current source; and
a drain connected to a fourth node.

3. The operational amplifier of claim 1, wherein the first overdriving unit comprises:
a third PMOS transistor comprising:
a gate to which a first bias voltage is applied;
a source to which a driving voltage is applied; and
a drain connected to a fifth node; and
a fourth PMOS transistor comprising:
a gate connected to a sixth node;
a source connected to the fifth node; and
a drain connected to the fourth node.

4. The operational amplifier of claim 3, wherein the first overdriving unit comprises a first switch comprising:
one end connected to the drain of the fourth PMOS transistor; and
another end connected to the fourth node.

5. The operational amplifier of claim 4, wherein, in response to the first switch being turned on, the operational amplifier is configured to perform an overdriving operation at the rising edge.

6. The operational amplifier of claim 1, wherein the second overdriving unit comprises:
a third NMOS transistor comprising:
a gate connected to a seventh node;
a source connected to an eighth node; and
a drain connected to the second node; and
a fourth NMOS transistor comprising:
a gate to which a second bias voltage is applied;
a source connected to a ground voltage; and
a drain connected to the eighth node.

7. The operational amplifier of claim 6, wherein the second overdriving unit comprises a second switch comprising:
one end connected to the second node; and
another end connected to the drain of the third NMOS transistor.

8. The operational amplifier of claim 7, wherein, in response to the second switch being turned on, the operational amplifier is configured to perform an overdriving operation at the falling edge.

9. The operational amplifier of claim 1, further comprising a buffer unit connected to the first and second overdriving units, the buffer unit configured to provide an output voltage.

10. The operational amplifier of claim 9, wherein the buffer unit comprises a CMOS-type transistor.

11. The operational amplifier of claim 10, wherein the buffer unit comprises:
a fifth PMOS transistor comprising:
a gate connected to the sixth node;
a source to which a driving voltage is applied; and
a drain connected to the output terminal; and
a fifth NMOS transistor comprising:
a gate connected to the seventh node;
a source connected to a ground voltage; and
a drain connected to the output terminal.

12. The operational amplifier of claim 9, wherein the buffer unit comprises an NMOS-type transistor.

13. The operational amplifier of claim 12, wherein the buffer unit comprises:
a sixth NMOS transistor comprising:
a gate connected to the sixth node;
a source to which the driving voltage is applied; and
a drain connected to the output terminal; and
a seventh NMOS transistor comprising:
a gate connected to the seventh node;
a source connected to a ground voltage; and
a drain connected to the output terminal.

14. The operational amplifier of claim 12, further comprising a voltage detection unit positioned between the buffer unit and the first overdriving unit, the voltage detection unit being configured to operate the first overdriving unit.

15. The operational amplifier of claim 14, wherein the voltage detection unit comprises:
a sixth PMOS transistor comprising:
a gate to which a third bias voltage is applied;
a source to which the driving voltage is applied; and
a drain connected to the gate of the fourth PMOS transistor; and
an eighth NMOS transistor comprising:
a gate connected to the sixth node;
a source connected to the output terminal; and
a drain connected to the gate of the fourth PMOS transistor.

16. The operational amplifier of claim 12, wherein, in response to the buffer unit comprising an NMOS-type transistor, the first overdriving unit is further configured to operate such that the operational amplifier is configured to perform overdriving operation at the rising edge.

17. The operational amplifier of claim 9, wherein the buffer unit comprises a PMOS-type transistor.

18. The operational amplifier of claim 17, wherein the buffer unit comprises:
a seventh PMOS transistor comprising:
a gate connected to the sixth node;
a source to which the driving voltage is applied; and
a drain connected to the output terminal; and
an eighth PMOS transistor comprising:
a gate connected to the seventh node;
a source connected to a ground voltage; and
a drain connected to the output terminal.

19. The operational amplifier of claim 17, further comprising a voltage detection unit positioned between the buffer unit and the second overdriving unit, the voltage detection unit being configured to operate the second overdriving unit.

20. The operational amplifier of claim 19, wherein the voltage detection unit comprises:
a ninth PMOS transistor comprising:
a gate connected to the seventh node;
a source connected to the output terminal; and
a drain connected to the gate of the third NMOS transistor; and
a ninth NMOS transistor comprising:
a gate to which a fourth bias voltage is applied;
a source to which the ground voltage is applied; and
a drain connected to the gate of the third NMOS transistor.

21. The operational amplifier of claim 17, wherein, in response to the buffer unit comprising a PMOS type transistor, the second overdriving unit is further configured to operate such that the operational amplifier is configured to perform an overdriving operation at the falling edge.

22. A method for an operational amplifier comprising first and second input terminals and an output terminal, an input voltage being applied to the first input terminal, the second input terminal being connected to the output terminal, the input voltage applied to the first input terminal being overdriven to have a certain level to be outputted to the output terminal, the method comprising:
performing, with first and second overdriving units, an overdriving operation at a rising edge and a falling edge, respectively, the method further comprising:
providing, with a first stage unit comprising the first and second input terminals and the output terminal, a first bias current;
providing, with a first overdriving unit connected to the first stage unit, an offset current for performing the overdriving operation at the rising edge; and
providing, with a second overdriving unit connected to the first stage unit, an offset current for performing the overdriving operation at the falling edge.

23. The method of claim 22, further comprising, in response to a first switch being turned on, performing an overdriving operation at the rising edge.

24. The method of claim 22, further comprising, in response to a second switch being turned on, performing an overdriving operation at the falling edge.

25. The method of claim 22, further comprising:
providing, with a buffer unit connected to the first and second overdriving units, an output voltage.

26. The method of claim 25, wherein the buffer unit comprises a CMOS-type transistor.

27. The method of claim 25, wherein the buffer unit comprises an NMOS-type transistor.

28. The method of claim 27, further comprising operating, with a voltage detection unit positioned between the buffer unit and the first overdriving unit, the first overdriving unit.

29. The method of claim 27, further comprising, in response to the buffer unit comprising an NMOS-type transistor, operating the first overdriving unit, such that the method further comprises performing overdriving operation at the rising edge.

30. The method of claim 26, wherein the buffer unit comprises a PMOS-type transistor.

31. The method of claim 30, further comprising operating, with a voltage detection unit positioned between the buffer unit and the second overdriving unit, the second overdriving unit.

32. The method of claim 30, further comprising, in response to the buffer unit comprising a PMOS-type transistor, operating the second overdriving unit, such that the method further comprises performing an overdriving operation at the falling edge.

* * * * *